United States Patent [19]

Mitamura et al.

[11] 4,215,296
[45] Jul. 29, 1980

[54] TELEVISION DEFLECTION CIRCUIT

[75] Inventors: Ichiro Mitamura, Tokyo; Masayuki Yasumura, Yokohama, both of Japan

[73] Assignee: Sony Corporation, Tokyo, Japan

[21] Appl. No.: 964,720

[22] Filed: Nov. 29, 1978

[30] Foreign Application Priority Data

Dec. 19, 1977 [JP] Japan ................... 52-152609

[51] Int. Cl.² ............................................. H01J 29/70
[52] U.S. Cl. .................................... 315/408; 315/411
[58] Field of Search ............................... 315/408, 411

[56] References Cited

FOREIGN PATENT DOCUMENTS 1406895 9/1975 United Kingdom .
1475772 6/1977 United Kingdom .

Primary Examiner—Malcolm F. Hubler
Attorney, Agent, or Firm—Lewis H. Eslinger; Alvin Sinderbrand

[57] ABSTRACT

A television horizontal deflection circuit is provided with a flyback transformer and a switching regulator transformer which are substantially magnetically independent of each other and which are connected with their primaries in series with a switching device and a source of input voltage. The secondary winding of the switching regulator transformer supplies power to a regulated D.C. voltage supply, which in turn supplies power to a resonant circuit. The resonant circuit is connected to a reference potential through the switching device and includes a damper diode, a resonant capacitor, a deflection coil and a series connected capacitor. A secondary winding of the flyback transformer is used to derive a high voltage for use in the high voltage anode of a television picture tube. In a preferred embodiment, the flyback transformer contains an additional winding which is connected between the regulated D.C. voltage supply and the resonant circuit. This additional or feedback winding is inductively coupled with the primary winding of the flyback transformer so that the flow of current through that primary winding while the switching means is conductive will impede the flow of current from the regulated D.C. voltage supply to the resonant circuit.

3 Claims, 15 Drawing Figures

FIG. 2A
FIG. 2B
FIG. 2C
FIG. 2D
FIG. 2E
FIG. 2F
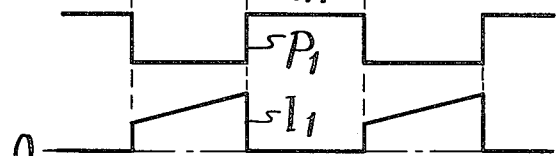
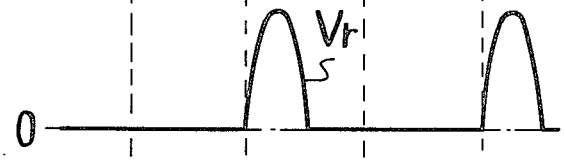
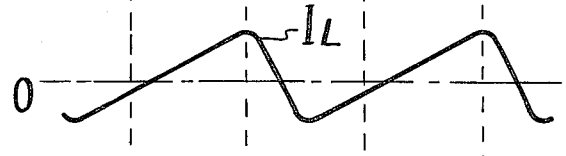
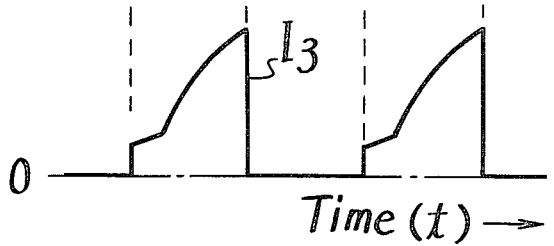

FIG. 3A
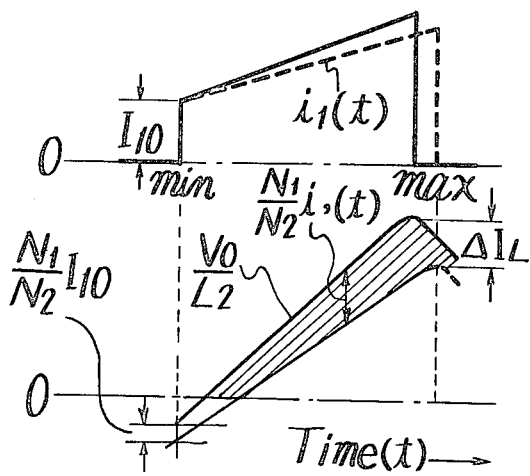
FIG. 3B
FIG. 4
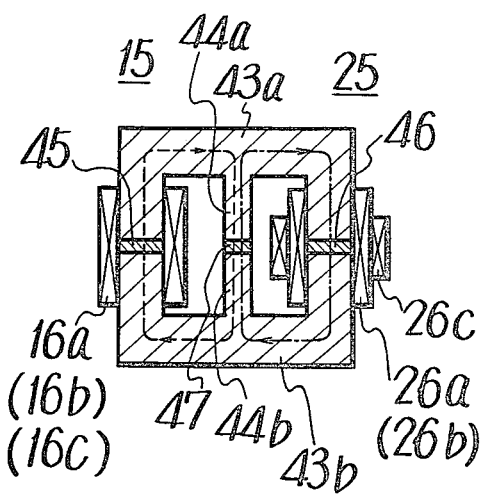
FIG. 5
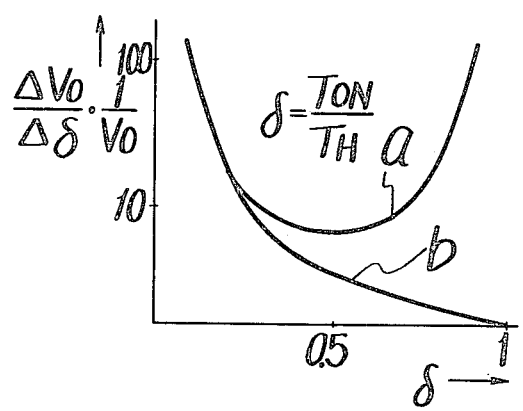
FIG. 6
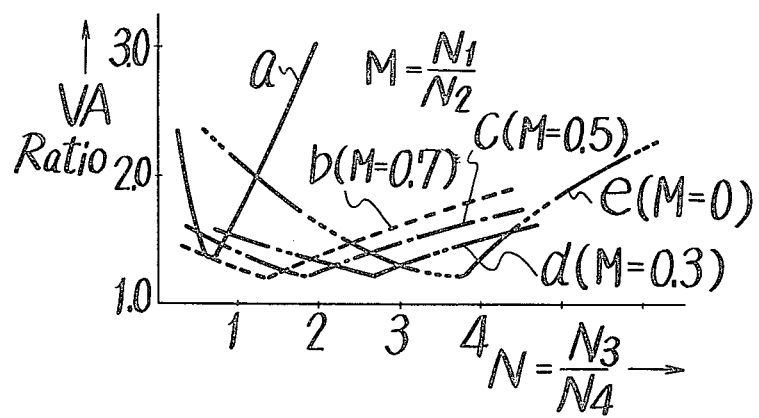

TELEVISION DEFLECTION CIRCUIT

BACKGROUND OF THE INVENTION

1. Field of the Invention

This invention relates to a horizontal deflection circuit suitable for use in a raster-scanned cathode-ray-tube, such as that found in most television receivers.

2. Description of the Prior Art

A circuit in which a DC current is turned on and off by a switching element to produce a regulated DC voltage as a supply voltage for a horizontal deflection circuit is disclosed by Mr. Peter L. Wessel in the publication "IEEE Transactions on Broadcast and Television Receivers", August 1972, vol. BRT-18, No. 3, at pages 177 to 182. This circuit (hereinafter referred to as a Wessel's circuit) is the combination of a horizontal deflection circuit and a voltage supply circuit, in which a switching transistor used as the switching element in the deflecting circuit is also used as the switching element in the voltage supply circuit. The Wessel's circuit has the advantage that it can be fed by an unstabilized supply voltage and can produce a stabilized deflection current and a stabilized high voltage. On the other hand, however, this circuit has the drawback that considerable power is required for producing the high voltage since it supplies power to its high voltage winding solely from its regulated voltage supply circuit; meaning that all of the power which is supplied to the high voltage winding must first pass through a switching power supply transformer, with its inevitable power losses. In addition, a high inductance is required for the windings of the switching power supply transformer resulting in a high cost. Further, this circuit causes a relatively large DC current to pass through the switching element decreasing the efficiency of the whole circuit.

SUMMARY OF THE INVENTION

It is an object of this invention to provide a television horizontal deflection circuit which is free from the above drawbacks.

It is another object of this invention to provide a television horizontal deflection circuit in which the current flowing through the switching element is decreased to reduce its loss so that the deflection circuit is improved in efficiency.

It is yet another object of this invention to provide a television horizontal deflection circuit in which the high voltage used for the high voltage anode of a picture tube can be obtained at a high efficiency.

It is still another object of this invention to provide a television horizontal deflection circuit which is less expensive to make than such deflection circuits of the prior art.

It is yet another object of this invention to provide a television horizontal deflection circuit in which the high voltage used for the high voltage anode of a picture tube can be derived efficiently but without interference from the operation of a switching regulator transformer used to supply power to its deflection cell.

In accordance with an aspect of this invention, a television horizontal deflection circuit is provided which includes means for delivering an input voltage; means for switching between alternately conductive and non-conductive states; a switching regulator transformer having a switching regulator primary winding connected in series between the input voltage delivering means and the switching means and having a switching regulator secondary winding; means for receiving power from the switching regulator winding and for supplying a regulated D.C. voltage; a resonant circuit receiving power from the means for supplying a regulated D.C. voltage and connected to a reference potential through the means for switching, such resonant circuit including a damper diode, a resonant capacitor, a deflection coil and a series connected capacitor; and a flyback transformer having a flyback primary winding connected in series with the switching regulator primary winding between the input voltage delivering means and the switching means and having a flyback secondary winding for deriving a high voltage for use in the high voltage anode of a television picture tube, with the flyback transformer and the switching regulator transformer being substantially magnetically independent of each other.

According to a preferred embodiment of this invention the flyback transformer further includes a feedback winding which connects the resonant circuit to the means for supplying a regulated D.C. voltage. The feedback winding is inductively coupled with the flyback primary winding so that the flow of current from the means for supplying a regulated D.C. voltage to the resonant circuit will be impeded by the flow of current through the flyback primary winding while the switching means is conductive.

The above, and other objects, features and advantages of the invention, will be apparent in the following detailed description of illustrative embodiments of the invention which is to be read in connection with the accompanying drawings.

BRIEF DESCRIPTION OF THE DRAWINGS

FIGS. 2A through 2F are waveform diagrams used for explaining the operations of the circuit of FIG. 1;

FIGS. 3A and 3B are enlarged waveform diagrams used for explaining this invention;

FIG. 4 is a cross-sectional view showing one example of a transformer which is useable in the circuit of this invention;

FIG. 5 and FIG. 6 are graphs showing characteristic curves used for explaining this invention.

DESCRIPTION OF THE PREFERRED EMBODIMENTS

A description will hereinafter be given of several embodiments of a television horizontal deflection circuit according to this invention with reference to the drawings.

Figure 1:
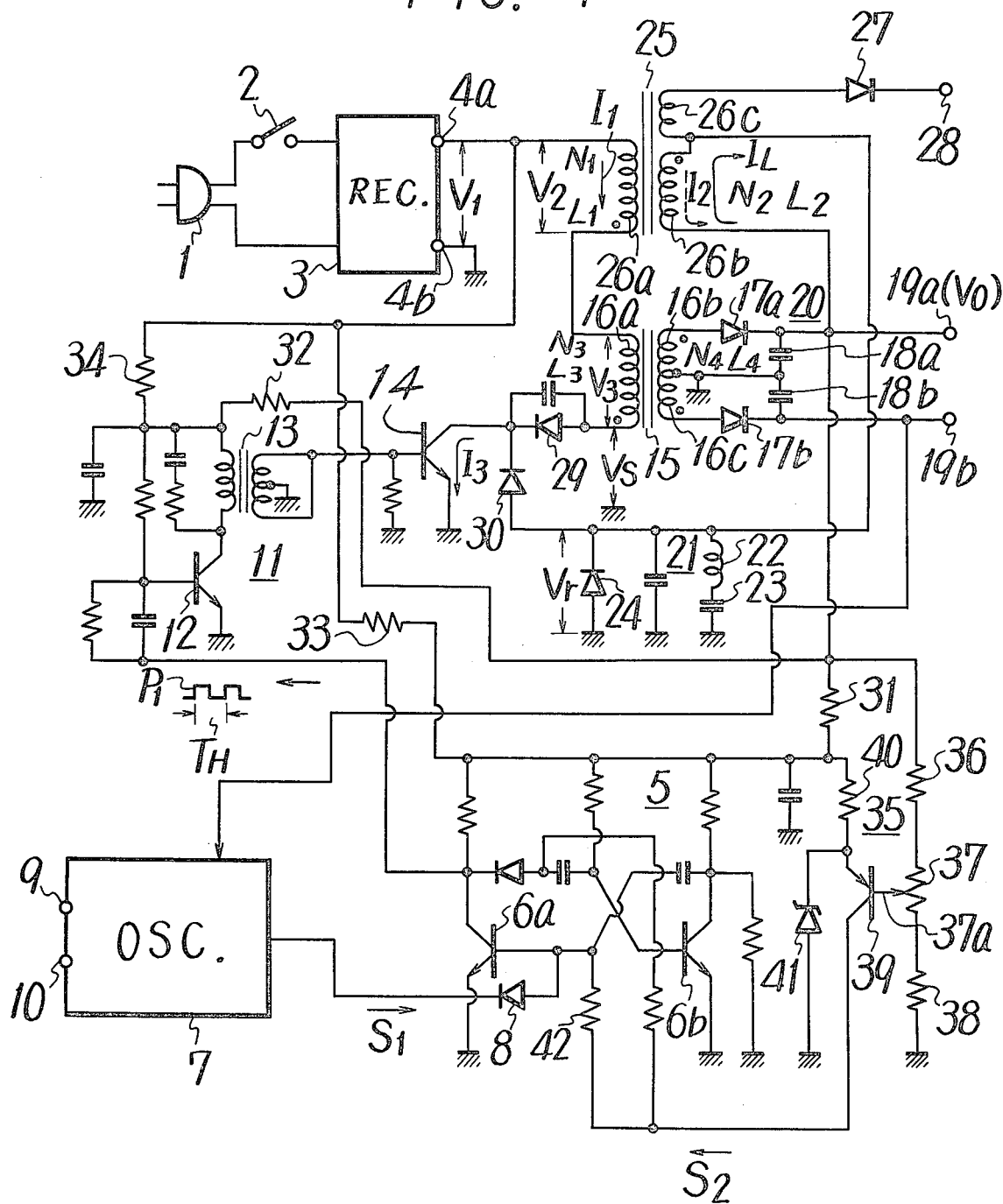
FIG. 1 is a connection diagram showing one example of a television horizontal deflection circuit according to this invention.

Referring now to FIG. 1, an AC voltage is supplied through a power supply plug 1 and a power line switch 2 to a rectifier 3 to obtain a DC voltage between terminals 4a and 4b thereof. There is provided a pulse oscillator 5, which is, in this example, an astable multivibrator circuit formed of a pair of transistors 6a and 6b and capable of changing its pulse width. The pulse oscillator 5 is adapted to produce a pulse $P_1$ (refer to FIG. 2A) with its period $T_H$ being always kept constant by a control pulse or signal $S_1$. This signal $S_1$ is fed from an oscillator 7 through a diode 8 to the base electrode of transistor 6a of the pulse oscillator 5. The oscillator 7 is supplied at its terminal 9 with a horizontal synchronizing signal separated from a video signal and also at its input terminal 10 with a signal for comparison of automatic frequency control (AFC). Thus, the control pulse $S_1$ from the oscillator 7 serves to determine a time point at which the pulse $P_1$ from the pulse oscillator 5 falls from a high to a low level. The time point at which the pulse $P_1$ rises from a low to a high level will be determined by a time constant of the pulse oscillator 5 itself and a compared signal $S_2$ from a voltage comparison circuit which will be described later.

The pulse $P_1$ from the pulse oscillator 5 is then supplied to the base electrode of a driving transistor 12 which forms part of a drive circuit 11. An output of the transistor 12 at its collector electrode is fed through a driving transformer 13 to the base electrode of a transistor 14, which serves as a means for switching between alternately conducting and non-conducting states. A current flowing through the collector-emitter path of the transistor 14 is supplied through a primary winding 16a of a switching regulator transformer 15. The current flowing through the primary winding 16a is turned ON and OFF by the transistor 14, thereby causing secondary and tertiary windings 16b and 16c to induce voltages. Diodes 17a and 17b and capacitors 18a and 18b are respectively connected to the transformer 15 to carry out a rectifying and filtering operation. Thus, the transistor 14 is driven ON and OFF by the pulse $P_1$ from the pulse oscillator 5 so that the current flowing through the primary winding 16a of the transistor 15 is turned ON and OFF. As a result, DC voltages are obtained respectively at terminals 19a and 19b and since capacitors 18a and 18b are preferably quite large, these voltages remain relatively constant throughout the operating cycle of the transistor 14. As described above, the transistor 14, the transformer 15, the diodes 17a and 17b, and the capacitors 18a and 18b are designed to form a voltage supply circuit 20.

A resonant circuit 21 is connected as the load of voltage supply circuit 20. Resonant circuit 21 includes a horizontal deflection coil 22, a series-connected capacitor 23, a resonant capacitor, and a damper diode 24. The transistor 14, used as the switching element of the voltage supply circuit 20, is also used as a switching element of the resonant circuit 21.

The circuit arrangement mentioned above is well known. Generally, in the prior art, the collector electrode of the switching transistor 14 is connected through the primary winding 16a of the switching regulator transformer 15 directly to the rectifier output terminal 4a, and the resonant circuit 21 is connected directly to the output terminal 19a of the voltage supply circuit 20.

In this example of the invention, an auxiliary transformer 25 is provided to supply its primary winding 26a with one part or all of the current flowing through the primary winding 16a of the switching regulator transformer 15. Further, a current is supplied from the output terminal 19a of the voltage supply circuit 20 through a secondary winding 26b of the auxiliary transformer 25 to the resonant circuit 21. The auxiliary transformer 25 is further provided with a flyback winding or high voltage winding 26c thereby to form a so-called flyback transformer. A high voltage from the flyback transformer 25 is fed through a diode 27 to an output terminal 28. Such a high voltage is commonly used to charge the second anode of a television picture tube.

Further, between the terminals 4a and 4b there is connected a series circuit of a first means for providing an inductance, in this embodiment the primary winding 26a of flyback transformer 25, a second means for providing an inductance, in this embodiment the primary winding 16a of switching regulator transformer 15, a diode 29, and a means for switching between alternately conductive and nonconductive states, in this embodiment the collector-emitter path of transistor 14. The voltage supply terminal 19a is connected through the secondary winding 26b of flyback transformer 25 to the resonant circuit 21 at its voltage supply side. Also, a diode 30 is inserted between the horizontal deflection coil 22 and the collector of transistor 14.

Further, in this embodiment of FIG. 1, the polarities of respective windings of the transformers 15 and 25 are selected in a manner as shown by black spots. Thus, while the transistor 14 is turned ON, a current $I_L$ flows in a direction indicated by a solid arrow from capacitor 18a through the secondary winding 26b of flyback transformer 25 to the resonant circuit 21 and then through diode 30 and transistor 14 to ground. Meanwhile, upon the turning-ON of the transistor 14, a current $I_1$ flows through the primary winding 26a of flyback transformer 25 to induce a current $I_2$ in the secondary winding 26b which flows therethrough in a direction indicated by a dotted arrow. Thus it can be seen that the flow of current $I_1$, through primary winding 26a impedes the flow of current $I_L$ from the voltage supply circuit 20 to the resonant circuit 21 and then to ground through transistor 14.

The DC voltage obtained at the terminal 19a of the voltage supply circuit 20 is connected through a resistor 31 to the pulse oscillator 5 and also through a resistor 32 to the drive circuit 11. Further, the DC voltage obtained at the terminal 4a of the rectifier 3 is connected through a resistor 33 to the pulse oscillator 5 and also through a resistor 34 to the drive circuit 11. Accordingly, immediately after the closing of the line switch 2 the circuits 5 and 11 are actuated by the DC output from the terminal 4a.

A voltage comparison circuit 35 is provided for stabilizing the output voltage of the voltage supply circuit 20. The comparison circuit 35 is formed in such a manner that a series circuit consisting of resistor 36, variable resistor 37 and resistor 38 is connected between the terminal 19a and the ground, and a movable contact 37a of the variable resistor 37 is connected to the base electrode of a transistor 39 whose emitter electrode is connected through a resistor 40 to the pulse oscillator 5 at its voltage supply side and also grounded through a Zener diode 41 serving as a constant voltage element. The collector electrode of transistor 39 is connected through a resistor 42 to the base electrode of transistor 6a of the oscillator 5. With the above arrangement, when the voltage at the voltage supply terminal 19a is changed, the collector potential of transistor 39 is also changed so that the rising time point of the pulse $P_1$ from oscillator 5 is changed. In this connection, when the voltage of terminal 19a is increased, the collector potential of transistor 39 is lowered so that a time interval where the pulse $P_1$ from oscillator 5 is in the state that will cause transistor 14 to be ON may be reduced. In this case, since the pulse oscillator 5 is applied with the control pulse $S_1$ from the oscillator 7 to control the falling time point of pulse $P_1$, the period $T_H$ of pulse $P_1$ is made constant. Such a feedback circuit is well known and hence a detailed description thereof will be omitted.

Next, a description will be given on an operation of the circuit as described above. When the plug 1 is connected to an AC power supply (not shown) and the switch 2 is closed, a DC voltage is produced between the terminals 4a and 4b of rectifier circuit 3. This DC voltage is fed respectively through resistors 33 and 34 to the pulse oscillator 5 and the drive circuit 11 so that the oscillator 5 may oscillate at its self oscillating period. The oscillating frequency of this case is selected lower than that of its normal condition, and when the control signal oscillator 7 and other circuits start their normal operations, the control signal $S_1$ from oscillator 7 and a control signal $S_2$ from transistor 39 are applied to the pulse oscillator 5 so that it will oscillate at a condition locked to a horizontal synchronizing signal.

Under such an oscillating condition of the pulse oscillator 5, the pulse $P_1$ is supplied through the drive circuit 11 to the base electrode of transistor 14 serving as switching element to turn it ON and OFF so that the current $I_1$ shown in FIG. 2B, which flows through the primary winding 26a of transformer 25 and accordingly through the primary winding 16a of transformer 15, is made intermittent, or alternately ON and OFF. Accordingly, voltages are induced respectively in the secondary and tertiary windings 16b and 16c thereof so that DC voltages are obtained at the terminals 19a and 19b, respectively. Therefore, after being actuated, DC current is supplied from the terminal 19a respectively through resistors 31 and 32 to the pulse oscillator 5 and the drive circuit 11, while DC current is delivered from the terminal 19b to supply power to the control signal oscillator 7. The flyback transformer 25 can supply a signal for AFC comparison to the input terminal 10 of oscillator 7. In this case, the ON interval $T_{ON}$ and the OFF interval $T_{OFF}$ of transistor 14 are controlled by the compared signal $S_2$ from transistor 39 so that the intervals $T_{ON}$ and $T_{OFF}$ correspond inversely to each other and so that a DC output voltage of the voltage supply circuit 20 is always kept constant.

FIG. 2C shows a waveform of a voltage $V_s$ obtained at the anode side of diode 29, FIG. 2D shows a waveform of a voltage $V_r$ across the damper diode 24, and FIG. 2E shows a waveform of the current $I_L$.

A consideration will now be taken of the ON time of transistor 14. Let it be assumed that the number of turns and inductance value of the primary and secondary windings 26a and 26b of the flyback transformer 25 are $N_1$, $L_1$ and $N_2$, $L_2$, respectively, and those of the primary and secondary windings 16a and 16b of the switching regulator transformer 15 are $N_3$, $L_3$ and $N_4$, $L_4$, respectively. Further, the voltage at the terminal 4a of rectifier 3 is taken as $V_1$ and that at the terminal 19a of voltage supply circuit 20 as $V_0$, respectively. Then, if the winding 26a and winding 26b of transformer 25 are closely coupled to each other and the coupling factor thereof is 1, the currents $I_1$ and $I_L$ are respectively expressed as follows:

$$I_1 = i_1(t) = \frac{1}{L_3}(V_1 - \frac{N_1}{N_2}V_0)t + I_{10} \quad (1)$$

$$I_L = i_l(t) = \frac{V_0}{L_2}t + I_{L0} - \frac{N_1}{N_2}i_1(t) \quad (2)$$

where $I_{10}$ and $I_{L0}$ are the initial values of currents $I_1$ and $I_L$ at the ON time of transistor 14. In the equation (2), a term $(N_1/N_2)i_1(t)$ represents the amount of current $I_2$ induced in the winding 26b by the current $I_1 = i_1(t)$ so that the current fed from the terminal 19a to the resonant circuit 21 as a load will be reduced by the above amount of current $I_2$.

In the above equation (1), if a term $(N_1/N_2)V_0$, which indicates a voltage obtained across the primary winding 26a of flyback transformer 25 due to the coupling between the primary and secondary windings 26a and 26b, is taken as $V_2$, and the difference voltage $(V_1 - V_2)$ is taken as $V_3$, it will be apparent from the equation (1) that the current $I_1$ flowing through the primary winding 16a will have a waveform with a rising slope of value $V_3/L_3$.

The switching regulator used in this invention is basically of a voltage rising and falling type. Thus $V_o$ can be either greater than or less than $V_1$. This switching regulator is quite high in control sensitivity as compared with the other types. Thus that the ON interval of transistor 14 need not be substantially increased even if the input voltage $V_3$ to the switching regulator is substantially decreased by the primary winding 26a of flyback transformer 25. A current reduction $\Delta I_L$ of current $I_L$ at its peak value caused by the induced current $I_2$ from the primary winding 26a is expressed as follows:

$$\Delta I_L = \frac{N_1}{N_2}[\frac{1}{L_3}(V_1 - \frac{N_1}{N_2}V_0)t_{max} + I_{10}] \quad (3)$$

In case of, for example, $N_1 = 50$ turns, $N_2 = 110$ turns, $L_3 = 8.7$ mH, $V_1 = 250$ volts, $V_0 = 140$ volts, $t_{max} = 38$ $\mu$sec, and $I_{10} = 0.5$ amp., $\Delta I_L$ is calculated at 0.60 ampere. In other words, the provision of the primary winding 26a causes the peak value of the current $I_L$ to be reduced by 0.6 ampere and hence a collector current $I_3$ (shown in FIG. 2F) of the transistor 14 will also become smaller than the prior art by 0.6 ampere.

FIGS. 3A and 3B show enlarged waveforms of FIGS. 2B and 2E. It will be noticed from these waveforms that, with the arrangement as mentioned above, the current $I_1$ flowing through the primary winding 26a of flyback transformer 25 can be reduced as indicated by dotted line in FIG. 3A, and that the current $I_L$ flowing through the secondary winding 26b can also be reduced as shown by dotted line in FIG. 3B. In this case, a portion shown by hatched lines in FIG. 3B is a current considered as being returned to the voltage supply circuit 20 from the secondary winding 26b of flyback transistor 25 during ON-interval of the transistor 14 and the average $\bar{I}_2$ of this returned current is expressed as follows:

$$\bar{I}_2 = \frac{N_1}{N_2}[2I_{10} + \frac{1}{L_3}(V_1 - \frac{N_1}{N_2}V_0)t_{max}]\frac{T_{ON}}{T_H} \cdot \frac{1}{2} \quad (4)$$

where $T_H$ is a period of the pulse $P_1$, or $T_H = T_{ON} + T_{OFF}$. In other words, the current which must be supplied from the secondary winding 16b to the capacitor 18a in order to maintain a desired voltage $V_0$ at that capacitor is decreased by the amount of current $\bar{I}_2$. In addition the current flowing through the diode 17a is reduced, thus to decreasing the power dissipated by it.

Since the loss of the resonant circuit 21 and the secondary winding 26b are constant, it is considered that a power corresponding to the above reduced current is supplied from the primary winding 26a to the secondary winding 26b in the flyback transformer 25. This supplied power is calculated by $V_0 \cdot \bar{I}_2$, or, using the values stated in the example above, about 35 watts.

The diodes 29 and 30 connected to the collector electrode of switching transistor 14 are provided for preventing reverse current. That is, upon turning-OFF the transistor 14, the voltages $V_s$ and $V_r$ are produced at the respective anode sides of diodes 29 and 30 as shown in FIGS. 2C and 2D. However, if these diodes 29 and 30 are not used (or if they are respectively short-circuited), during an interval of $V_r > V_s$ a current would flow from the resonant circuit 21 to the switching regulator transformer 15, and during an interval of $V_r < V_s$ a current would flow from the transformer 15 to the resonant circuit 21, so that the object of supplying a regulated voltage to the resonant circuit 21 would not be attainable. The diodes 29 and 30 are respectively used for preventing such currents from flowing. However, if the number of turns of the primary winding 26a of flyback transformer 25 is selected so as to satisfy $V_s > V_r$ at all times, the diode 29 can be omitted or short-circuited. Similarly, if a transistor driven by the pulse $P_1$ in parallel with the transistor 14 is provided with its collector-emitter path being connected in parallel with the damper diode 24, the same operation as described above can be made and, the diodes 29 and 30 can be omitted (See FIGS. 7–9, discussed below).

FIG. 4 shows one example of the switching regulator transformer 15 and flyback transformer 25 useable in this invention. In this example, both transformers are coupled together to form one body. In other words, a pair of E-shaped magnetic cores 43a and 43b are coupled with leg portions thereof being opposed to each other. One leg portion thereof is wound with the primary, secondary and tertiary windings 16a, 16b and 16c to form the switching regulator transformer 15, and another leg portion thereof is wound with the primary, secondary and tertiary windings 26a, 26b and 26c to form the flyback transformer 25. The center leg portions 44a and 44b are provided to prevent the transformers 15 and 25 from magnetically coupled so that the both transfmormers can make substantially individual operation. Thus, the efficiency can be prevented from being lowered due to eddy loss within windings caused by the coupling of the both, and the windings 26b and 26c are substantially more closely coupled to winding 26a than they are to windings 16a, 16b, or 16c. The magnetic legs of cores 43a and 43b are separated on the left side, as shown in FIG. 4, by core gap 45 and on the right side by core gap 46, both made of non-magnetic material, while the center leg portions of the cores 43a and 43b are separated by a magnetic material 47, such as ferrite sheet, which corresponds to the core gaps 45 and 46 in thickness, for facilitating magnetic short-circuiting. In this case, the polarity of each winding is adapted to satisfy the condition of FIG. 1. Also the polarity of the windings is arranged so that when turning-ON the transistor 14, if magnetic flux is assumed to appear in a direction indicated by dotted lines based upon the current flowing through the primary winding 16a of transformer 15, magnetic flux is produced in a direction shown by one-dot-chain lines according to the current flowing through the secondary winding 26b of transformer 25. As a result, both magnetic fluxes are cancelled by each other at the center magnetic leg portion. These transformers 15 and 25 need not be formed in an integral manner as shown in FIG. 4 but can be formed separately.

FIG. 5 is a graph showing control sensitivity of the switching regulator according to this invention, in which the abscissa represents $\sigma (=T_{ON}/T_H)$ and the ordinate represents $\Delta V_0/\Delta\sigma \cdot 1/V_0$. Now, with $M=N_1/N_2$ and $N=N_3/N_4$ being taken, when $M/N=N_1N_4/N_2N_3=0$, or $N_1=0$ (or feedback is zero), the control characteristic exhibits normal voltage rising and falling type switching regulator characteristic such as shown by a curve a in FIG. 5. Further, when $M/N=1$, or the feedback factor is 1, voltage falling characteristic such as shown by a curve b is obtained. The characteristic curve a shows the characteristic of the Wessel's circuit. According to this invention, if the number of turns of the winding 26a or 26b or both is properly selected, the control sensitivity can be selected to be a given characteristic between the curves a and b shown in FIG. 5.

Now, a consideration will be taken of the ratio of the product of voltage and current (VA) fed transistor 14 to that fed the switching element of the conventional horizontal deflection circuit. In FIG. 6, the abscissa represents a turn ratio $N=N_3/N_4$ and the ordinate represents the VA ratio. In the case of the conventional Wessel's circuit, the ratio of VA represents the minimum value at a point in the vicinity of $N \approx 0.8$ as shown by a curve a in FIG. 6. In other words, the minimum value can not be freely selected in the Wessel's circuit. According to this invention, however, with $M=N_1/N_2$ being properly selected, the minimum value can be freely selected as shown by curves b, c, d and e in FIG. 6. It is quite practical to select the turn ratio N in a range between 1 and 2, which is an easily designed value.

Figure 7:
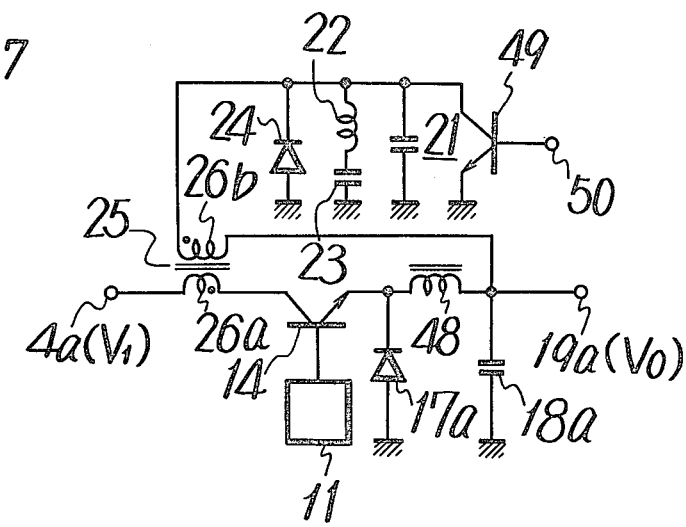
FIGS. 7, 8 and 9 are connection diagrams respectively showing other embodiments of this invention.
Figure 8:
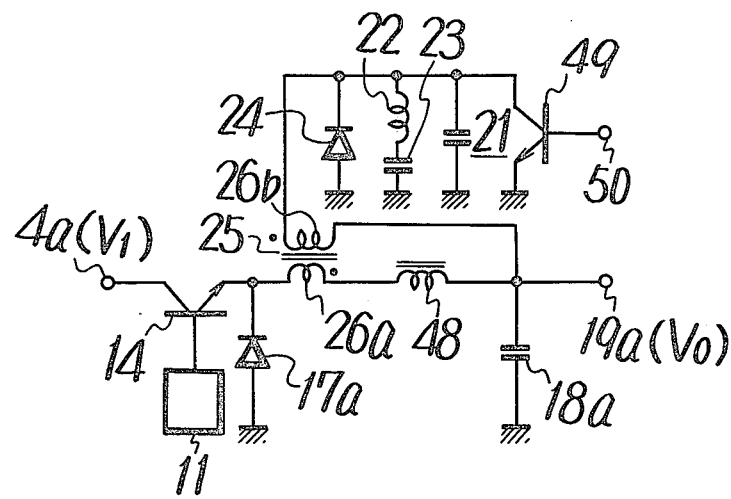
Figure 9:
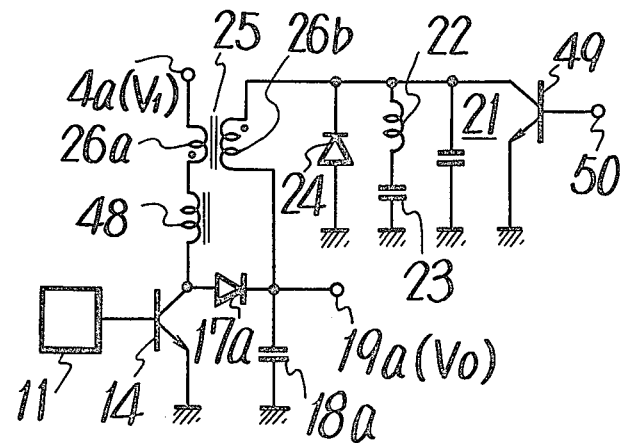

FIG. 7, FIG. 8 and FIG. 9 show other embodiments of this invention, in which elements corresponding to those of FIG. 1 are indicated by the same reference numerals with their description being omitted.

In the embodiments shown in FIGS. 7 to 9, the switching regulator transformer 15 shown in FIG. 1 is replaced by a choke coil 48, and in addition to the switching transistor 14 there is provided another switching transistor 49 exclusively for the resonant circuit 21. This transistor 49 is supplied at its base electrodes with a driving signal in synchronism with the driving signal supplied to the base of transistor 14. The other portions are nearly the same in operation as those of FIG. 1 and hence the description therefor will be omitted.

As described above, according to this invention, the current flowing through the transistor serving as a switching element of a resonant circuit can be made smaller than in the conventional Wessel's circuit, thereby reducing the power dissipated in such a transistor and the amount of a current which must be supplied by the regulated voltage supply. Accordingly, this invention has an advantage of improving the efficiency of the whole circuit in several ways.

It is to be understood that, in this specification and the claims that follow, the words "television deflection circuit" are intended to cover a line frequency deflection circuit, whether it be used in a standard television receiver or in a raster-scanned cathode-ray tube employed in any other sort of electronic video device, such as, for example, a computer terminal.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim as our invention:

1. A television horizontal deflection circuit comprising:
   means for delivering an input voltage;
   means for switching between alternately conductive and non-conductive states;
   a switching regulator transformer having a switching regulator primary winding connected in series between said input voltage delivering means and said switching means and having a switching regulator secondary winding;
   means for receiving power from said switching regulator secondary winding and for supplying a regulated D.C. voltage;
   a resonant circuit receiving power from said means for supplying a regulated D.C. voltage and connected to a reference potential through said means for switching, said resonant circuit including a damper diode, a resonant capacitor, a deflection coil and a series-connected capacitor; and
   a flyback transformer including a flyback primary winding connected in series with said switching regulator primary winding between said input voltage delivery means and said switching means, and a flyback secondary winding for deriving a high voltage for use in the high voltage anode of a television picture tube, said flyback transformer, said switching regulator transformer being substantially magnetically independent of each other.

2. A television horizontal deflection circuit according to claim 1; wherein said flyback transformer further includes a feedback winding connecting said resonant circuit to said means for supplying a regulated D.C. voltage, said feedback winding being inductively coupled with said flyback primary winding so that the flow of current from said means for supplying a regulated D.C. voltage to said resonant circuit will be impeded by the flow of current through said flyback primary winding while said switching means is conductive.

3. A television horizontal deflection circuit according to claim 2; wherein said means for switching includes a transistor having an input electrode supplied with a substantially rectangular waveform, an output electrode connected to a reference potential, and another output electrode connected in series with both said switching regulator transformer and flyback transformer and being also connected to said resonant circuit.

* * * * *